United States Patent
Vogt et al.

(10) Patent No.: US 8,901,702 B1
(45) Date of Patent: Dec. 2, 2014

(54) PROGRAMMABLE ELECTRICAL FUSE WITH TEMPERATURE GRADIENT BETWEEN ANODE AND CATHODE

(71) Applicant: Honeywell International Inc., Morristown, NJ (US)

(72) Inventors: Eric E. Vogt, Independence, MN (US); Paul S. Fechner, Plymouth, MN (US); Gordon A. Shaw, Plymouth, MN (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 13/891,280

(22) Filed: May 10, 2013

(51) Int. Cl.
H01L 29/00 (2006.01)
H01L 21/768 (2006.01)
H01L 23/525 (2006.01)

(52) U.S. Cl.
CPC ...... *H01L 23/5256* (2013.01); *H01L 21/76888* (2013.01)
USPC ........................................ 257/529

(58) Field of Classification Search
CPC ................ H01L 23/5256; H01L 23/5252
USPC .......... 257/209, 529, E23.149; 438/132, 215, 438/281, 333, 467, 601
See application file for complete search history.

(56) References Cited

U.S. PATENT DOCUMENTS

| | | | |
|---|---|---|---|
| 5,444,287 A | 8/1995 | Bezama et al. | |
| 6,624,499 B2 * | 9/2003 | Kothandaraman et al. | ... 257/529 |
| 6,933,591 B1 | 8/2005 | Sidhu et al. | |
| 7,242,072 B2 | 7/2007 | Kothandaraman et al. | |
| 7,575,958 B2 | 8/2009 | Hoefler et al. | |
| 7,757,200 B2 | 7/2010 | Moy et al. | |
| 7,851,885 B2 | 12/2010 | Kim et al. | |
| 7,960,809 B2 | 6/2011 | Kothandaraman et al. | |
| 8,004,059 B2 | 8/2011 | Kim et al. | |
| 2006/0220174 A1 | 10/2006 | Brown et al. | |
| 2009/0243032 A1 | 10/2009 | Chen | |
| 2010/0224956 A1 | 9/2010 | Kim et al. | |

OTHER PUBLICATIONS

Tonti, "eFuse Design and Reliability," retrieved from the internet on May 10, 2013 at: http://paris.utdallas.edu/ssiri08/Tonti_SSIRI_eFuse_V2.pdf., 3 pages.

* cited by examiner

*Primary Examiner* — Quoc Hoang (74) *Attorney, Agent, or Firm* — Shumaker & Sieffert, P.A.

(57) ABSTRACT

In some examples, a programmable electrical fuse includes at least one structural feature that increases a thermal gradient between an anode and a cathode of the programmable electrical fuse. For example, a device may include a semiconductor substrate, an electrically insulating layer overlying the semiconductor substrate, and a programmable electrical fuse overlying a portion of the electrically insulating layer. The programmable electrical fuse may include a cathode, an anode, and a conductor link connecting the cathode and the anode. The electrically insulating layer may define a first thickness between the semiconductor substrate and the cathode and a second thickness between the semiconductor substrate and the anode, and the first thickness being less than the second thickness.

16 Claims, 9 Drawing Sheets

PROGRAMMABLE ELECTRICAL FUSE WITH TEMPERATURE GRADIENT BETWEEN ANODE AND CATHODE

TECHNICAL FIELD

The disclosure describes programmable electrical fuses.

BACKGROUND

Programmable electrical fuses may be used as non-volatile data storage elements in a semiconductor device, such as a silicon-on-insulator (SOI) semiconductor device. A programmable electrical fuse may include an anode, a cathode, and a conductor link connecting the anode and the cathode. Programmable electrical fuses are one-time programmable devices in which the electrical resistance of the fuse may be increased by blowing the fuse, e.g., destroying the conductor link or significantly increasing the electrical resistance of the conductor link. A low electrical resistance state of the programmable electrical fuse may correspond to a first value (e.g., a 0 or a 1) and a high electrical resistance state of the programmable electrical fuse may correspond to a second value (e.g., a 1 or a 0).

Some programmable electrical fuses can be programmed by directing high current density through a conductor link, which blows the conductor link, increasing the electrical resistance of the fuse. Other programmable electrical fuses may include conductor link that includes a polysilicon layer and a silicide layer. These types of programmable electrical fuses may be programmed using electromigration. During the electromigration process, electron wind pushes silicide atoms out of the conductor link. The removal of the silicide from the conductor link substantially increases the electrical resistance of the conductor link.

SUMMARY

The disclosure describes semiconductor devices comprising programmable electrical fuses each including at least one structural feature that increases a thermal gradient between an anode and a cathode of the electrical fuse. In some examples, the at least one structural feature includes a thinner electrically insulating layer between a cathode of the electrical fuse and an underlying semiconductor layer than between an anode of the electrical fuse and the underlying semiconductor layer. The thinner electrically insulating layer between the cathode and the underlying semiconductor layer may increase the temperature gradient from the anode to the cathode. By increasing the temperature gradient, silicide electromigration may be facilitated, which may make programming the electrical fuse more robust and/or may allow use of lower programming currents compared to existing electrical fuse designs.

In some examples, the at least one structural feature may additionally or alternatively include a body-tie, and the cathode may be thermally coupled to the body-tie. The body-tie may serve as a heat sink from the cathode, reducing the thermal resistance of the cathode. This may increase the thermal gradient between the anode and the cathode. Additionally, a body-tie may allow polysilicon and metal to be routed over the body-tie, which may improve an areal density of interconnections compared to a device that includes an increased cathode size. Due to the increased thermal gradient, the body-tie also may allow the cathode to be smaller than a cathode in a programmable electrical fuse in which the cathode is not thermally coupled to a body-tie, which may improve an areal density of programmable electrical fuses in the semiconductor device.

In one example, the disclosure describes a semiconductor device that includes a semiconductor substrate, an electrically insulating layer overlying the semiconductor substrate, and a programmable electrical fuse overlying a portion of the electrically insulating layer. According to this example, the programmable electrical fuse comprises a cathode, an anode, and a conductor link physically connecting the cathode and the anode. The electrically insulating layer may define a first thickness between the semiconductor substrate and the cathode and a second thickness between the semiconductor substrate and the anode, and the first thickness may be less than the second thickness.

In another example, the disclosure describes a method that includes forming a programmable electrical fuse overlying a portion of an electrically insulating layer. In accordance with this example, the electrically insulating layer may overlie a semiconductor substrate, and the programmable electrical fuse may include a cathode, an anode, and a conductor link connecting the cathode and the anode. The electrically insulating layer may define a first thickness between the cathode and the semiconductor substrate and a second thickness between the anode and the semiconductor substrate, and the first thickness may be less than the second thickness.

In another example, the disclosure describes a device that includes a semiconductor layer, an electrically insulating layer overlying the semiconductor substrate, a silicon layer overlying a portion of the electrically insulating layer, a gate oxide overlying at least a portion of the silicon layer, and a programmable electrical fuse overlying a portion of the electrically insulating layer and the gate oxide. In accordance with this example, the programmable electrical fuse may include a cathode, an anode, and a conductor link physically connecting the cathode and the anode. The electrically insulating layer may define a first thickness between the semiconductor substrate and the cathode and a second thickness between the semiconductor substrate and the anode, and the first thickness may be less than the second thickness. Additionally, the cathode may overlie the gate oxide and may be thermally coupled to the silicon layer through the gate oxide.

The details of one or more examples are set forth in the accompanying drawings and the description. Other features, objects, and advantages will be apparent from the description and drawings, and from the claims.

DETAILED DESCRIPTION

The disclosure describes example programmable electrical fuses and techniques for forming electrical fuses. In accordance with aspects of the disclosure, a semiconductor device includes a semiconductor substrate (defining a layer), an electrically insulating layer overlying the substrate, and a programmable electrical fuse overlying the electrically insulating layer. The programmable electrical fuse may include a cathode, an anode, and a conductor link mechanically and electrically coupling the anode and the cathode. The programmable electrical fuse may include at least one structural feature that increases a thermal gradient between the anode and the cathode, e.g., compared to known programmable electrical fuses.

In some examples, the at least one structural feature that increases the thermal gradient between the anode and the cathode may include the structure of the electrically insulating layer. For example, the electrically insulating layer may define a first thickness between the cathode and the semiconductor layer and a second thickness between the anode and the semiconductor layer. The first thickness may be less than the second thickness. The electrically insulating layer may also act as a thermally insulating layer between the programmable electrical fuse and the semiconductor layer. The smaller thickness of the electrically insulating layer between the cathode and the semiconductor layer may reduce thermal resistance between the cathode and the semiconductor layer, e.g., compared to the thermal resistance between the anode and the semiconductor layer. This may increase a thermal gradient between the anode and the cathode, e.g., compared to devices in which the thickness of the electrically insulating layer is substantially the same adjacent to the anode and the cathode.

In some examples, the at least one structural feature may additionally or alternatively may include a body-tie thermally coupled to the cathode. The body-tie may electrically couple the semiconductor layer and a device layer (in which active semiconductor devices are formed). The body-tie may serve as a heat sink for the cathode, which may increase the thermal gradient between the anode and the cathode. In some examples, semiconductor devices may include both the body-tie and the electrically insulating layer having a first thickness between the cathode and the semiconductor layer and a second thickness between the anode and the semiconductor layer.

Figure 1A:
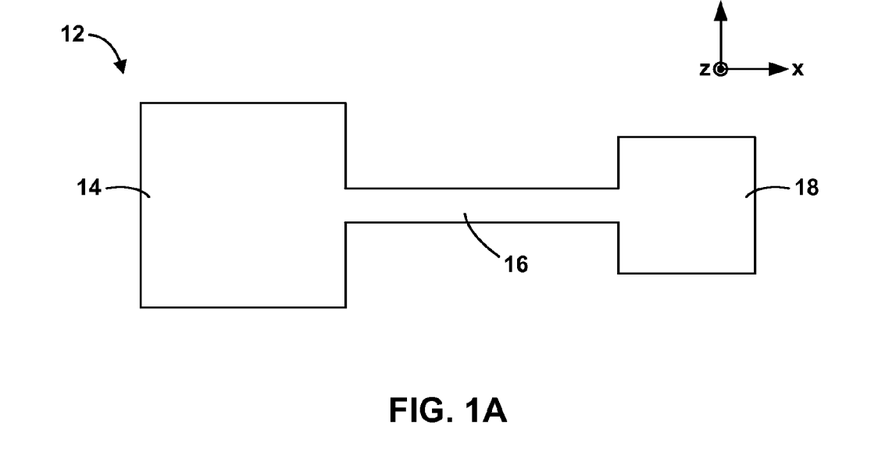
FIGS. 1A and 1B are conceptual and schematic diagrams illustrating an example semiconductor device including a programmable electrical fuse.
Figure 1B:
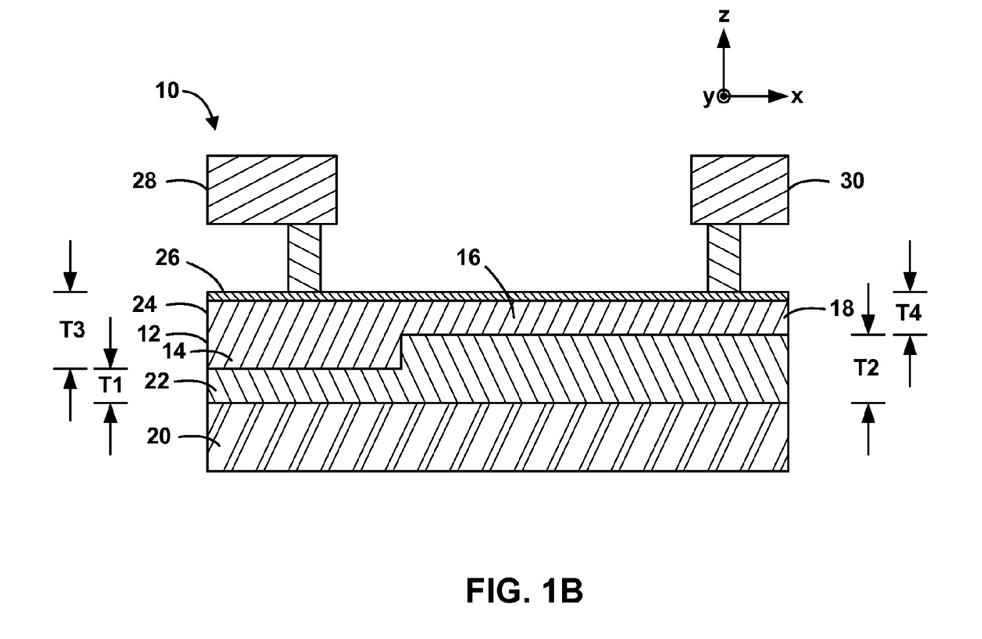

FIGS. 1A and 1B are conceptual and schematic diagrams illustrating an example semiconductor device 10 including a programmable electrical fuse 12. Although FIGS. 1A and 1B illustrate a single programmable electrical fuse 12, in some actual implementations, semiconductor device 10 may include a plurality of programmable electrical fuses 12, and may include other devices, such as transistors, resistors, capacitors, electrical interconnects among the devices, and the like. FIG. 1A is a plan diagram, and illustrates that programmable electrical fuse 12 includes a cathode 14, a conductor link 16, and an anode 18. Conductor link 16 mechanically and electrically connects cathode 14 and anode 16. In some examples, conductor link 16 may include the same materials from which cathode 14 and/or anode 18 are formed. As shown in FIG. 1A, cathode 14 defines a larger area in the x-y plane (where orthogonal x-y-z axes are shown in FIGS. 1A and 1B for purposes of illustration only) than does anode 18. In other examples, cathode 14 and anode 18 may define similar or substantially the same (e.g., the same or nearly the same) areas in the x-y plane.

Additionally, cathode 14 may define a larger width in the y-axis direction (and/or height in the z-axis direction) than does conductor link 16. This may increase an area over which cathode 14 can dissipate heat (e.g., due to an electrical current passing through programmable electrical fuse 12) compared to conductor link 16. Increased thermal dissipation may increase a thermal gradient between conductor link 16 and cathode 14, which may facilitate programming of programmable electrical fuse 12, as described below.

As shown in FIG. 1B, semiconductor device 10 include a semiconductor layer 20, an electrically insulating layer 22 overlying semiconductor layer 20, and programmable electrical fuse 12 overlying electrically insulating layer 22. Semiconductor device 10 thus may be a silicon on insulator (SOI) device. Semiconductor layer 20 may include, for example, silicon.

Electrically insulating layer 22 may include an electrically insulating material, such as, for example, an oxide. Example oxides include silicon dioxide or sapphire. In some examples, electrically insulating layer 22 may be formed on semiconductor layer 20. In other examples, electrically insulating layer 22 may be formed by implanting oxygen atoms in bulk silicon and annealing the material to form silicon dioxide.

Programmable electrical fuse 12 may include a multilayer structure, such as two layers, as shown in FIG. 1B. In the example of FIGS. 1A and 1B, programmable electrical fuse 12 includes a first layer 24 and a second layer 26. Second layer 26 overlies first layer 24. First layer 24 of programmable electrical fuse 12 may include, for example, silicon or polysilicon (polycrystalline silicon). Second layer 26 may include, for example, a silicide, such as cobalt silicide or titanium silicide. FIG. 1B illustrates second layer 26 in an intact state present throughout cathode 14, conductor link 16, and anode 18. In examples in which programmable electrical fuse 12 is programmed to a higher resistance state, second layer 26 may be at least partially depleted along at least a portion of conductor link 16 as a result of the programming.

In the example shown in FIG. 1B, semiconductor device 10 also includes electrical interconnects 28 and 30 for connecting cathode 14 and anode 18, respectively, to an electrical circuit (e.g., a voltage source). Electrical interconnects 28 and 30 may be formed of an electrically conductive material, such as, for example, copper, aluminum, or the like.

Second layer 26 is electrically conductive (i.e., has a low resistivity). Thus, when second layer 26 extends along first layer 24 between cathode 14 and anode 16, an electrical resistance of programmable electrical fuse 12 may be relatively low. Conversely, if second layer 26 does not extend along first layer 24 between cathode 14 and anode 16, an electrical resistance of programmable electrical fuse 12 may be relatively high (e.g., appreciably higher than when second layer 26 is intact). This difference in resistance allows programmable electrical fuse 12 to store information based on the resistance of programmable electrical fuse 12.

Programmable electrical fuse 12 may be programmed by directing an electrical signal through anode 18, conductor link 16, and cathode 14. The electrical signal causes electromigration of second layer 26 from conductor link 16 to cathode 14, depleting second layer 26 at the conductor link 16. During electromigration, first layer 24 may heat to a temperature of about 750° C. Polysilicon and silicon are electrically conductive at 750° C., which allows the electromigration process to continue even after second layer 26 is depleted from conductor link 16 and the connection between second layer 26 at cathode 14 and second layer 26 at anode 18 is broken. The removal of the second layer 26 from conductor link 16 substantially increases the electrical resistance of conductor link 16.

Electromigration of second layer 26 is facilitated by a temperature gradient between anode 18 and cathode 14. Because of this, a larger temperature gradient between anode 18 and cathode 14 may allow changes to the process of programming programmable electrical fuse 12 and/or to the structure of programmable electrical fuse 12. For example, with a larger temperature gradient, an electrical signal having a lower programming current may be used to program programmable electrical fuse 12. As other examples, a larger temperature gradient may allow the programmable electrical fuse 12 to be smaller (e.g., a smaller cathode 14).

FIG. 1B illustrates that electrically insulating layer 22 defines a first thickness T1 between semiconductor layer 20 and cathode 14. First thickness T1 is defined in the z-axis direction of FIG. 1B (i.e., substantially normal to a surface of semiconductor layer 20). Electrically insulating layer 22 also defines a second thickness T2 (in the z-axis direction of FIG. 1B) between semiconductor layer 20 and anode 18. First thickness T1 is less than second thickness T2.

Electrically insulating layer 22 also may be thermally insulating. Semiconductor layer 20, on the other hand, may be thermally conductive, such that semiconductor layer 20 may act as a heat sink for heat in programmable electrical fuse 12. Hence, because first thickness T1 is less than second thickness T2, thermal resistance between cathode 14 and semiconductor layer 20 may be less than thermal resistance between anode 18 and semiconductor layer 20 and thermal resistance between conductor link 16 and semiconductor layer 20. This may result in lower temperatures in cathode 14 relative to anode 18 and conductor link 16. In other words, the smaller first thickness T1 between cathode 14 and semiconductor layer 20 than second thickness T2 between anode 18 and semiconductor layer 20 may increase a thermal gradient between anode 18 and cathode 14. In this way, compared to examples in which the thickness of electrically insulating layer 22 between semiconductor layer 20 and cathode 14 is substantially the same as the thickness of electrically insulating layer 22 between semiconductor layer 20 and anode 14, a particular thermal gradient between cathode 14 and anode 18 may be achieved with a smaller cathode 14 size (e.g., measured in the x-y plane) or a larger thermal gradient may be achieved with the same sized cathode 14 (e.g., measured in the x-y plane).

In some examples, as shown in FIG. 1B, first thickness T1 may be about half of second thickness T2. In other examples, first thickness T1 may be less than half of second thickness T2. The larger the difference in first thickness T1 and second thickness T2, the greater the temperature gradient between anode 18 and cathode 14, all other factors being equal.

As shown in FIG. 1B, cathode 14 may define a third thickness T3 and anode 18 may define a fourth thickness T4. Third thickness T3 and fourth thickness T4 are measured in the z-axis direction of FIG. 1B and indicate the thickness of both first layer 24 and second layer 26, or only first layer 24. Third thickness T3 is greater than fourth thickness T4. This may result in cathode 14 having greater volume (and surface area) than anode 18, which may further contribute to the thermal gradient between anode 18 and cathode 14.

Figure 2A:
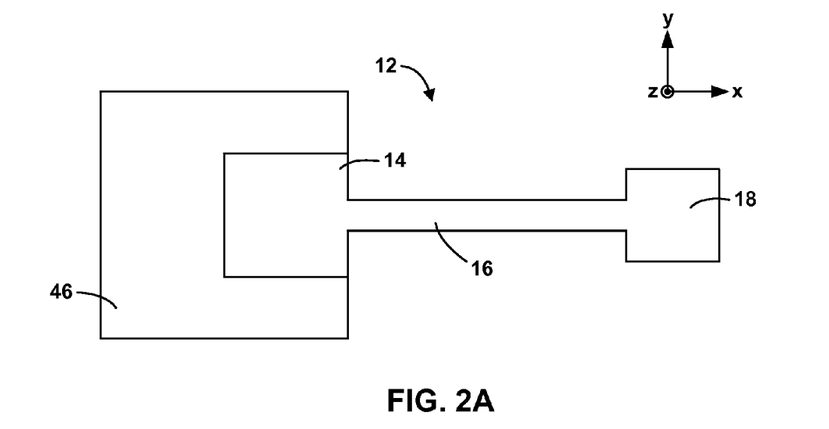
FIGS. 2A and 2B are conceptual and schematic diagrams illustrating an example semiconductor device including a programmable electrical fuse.
Figure 2B:
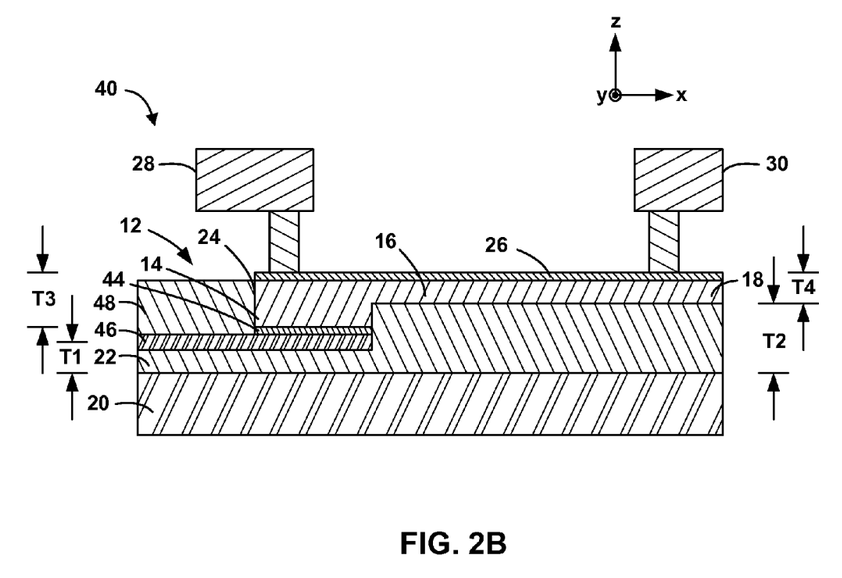

FIGS. 2A and 2B are conceptual and schematic diagrams illustrating another example semiconductor device 40 including a programmable electrical fuse 12. Although FIGS. 2A and 2B illustrate a single programmable electrical fuse 12, in some actual implementations, semiconductor device 40 may include a plurality of programmable electrical fuses 12, and may include other devices, such as transistors, resistors, capacitors, electrical interconnects among the devices, and the like. In some examples, semiconductor device 40, including programmable electrical fuse 12, may be similar to or substantially the same (e.g., the same or nearly the same) as semiconductor device 10 of FIGS. 1A and 1B, aside from the differences described herein.

Semiconductor device 40 includes programmable electrical fuse 12. Programmable electrical fuse 12 includes cathode 14, conductor link 16, and anode 18, as described with reference to FIGS. 1A and 1B. In contrast to programmable electrical fuse 12 of FIGS. 1A and 1B, programmable electrical fuse 12 of FIGS. 2A and 2B is thermally coupled to a body-tie 46. Body-tie 46 electrically couples the body (e.g., electrical fuse 12 or other active semiconductor devices formed above electrically insulating layer 22) of semiconductor device 40 to a body contact connected to semiconductor layer 20. In this way, the body-tie may eliminate a floating body effect, in which the body is electrically isolated from semiconductor layer 20. While the floating body effect may improve performance (i.e., speed) of a SOI device, a body-tie may provide radiation hardening to the device by making the device more resistant to single-event effects, such as heavy ion strikes.

Body-tie 46 is thermally coupled to programmable electrical fuse 12 through gate oxide 44. Gate oxide 44 may be formed of an oxide, such as silicon dioxide, and may prevent electrical connection between cathode 14 and body-tie 46, while allowing thermal coupling of body-tie 46 and cathode 14. In some examples, gate oxide 44 may define a relatively small thickness (measured in the z-axis direction of FIG. 2B), such as a thickness on the order of tens of angstroms.

As shown in FIGS. 2A and 2B, body-tie 46 increases an effective size of cathode 14 for purposes of thermal dissipation. As shown in FIG. 2A, in some examples, body-tie 46 may be larger than cathode 14 in both the x-axis direction and the y-axis direction. In other examples, body-tie 46 may be larger than cathode 14 in one of the x-axis direction or the y-axis direction, and may be the same size or smaller than cathode 14 in the other of the x-axis direction or the y-axis direction. This provides body-tie 46 with a relatively large volume in which to absorb heat transferred from cathode 14 and a relatively large surface area for dissipating the heat, e.g., to semiconductor layer 20. In this way, body-tie 46 may serve as a heat sink for cathode 14, receiving heat from cathode 14.

Additionally, in some examples, body-tie 46 may allow routing of electrical interconnections above (in the z-axis direction of FIG. 2B) body-tie 46. In some examples, routing interconnections may not be practical or possible over cathode 14. Thus, using body-tie 46 may allow increased interconnect density compared to simply increasing an area of cathode 14.

As shown in FIG. 2B, electrically insulating layer 22 may define a first thickness T1 at a location between semiconductor layer 20 and cathode 14 and a second thickness T2 between semiconductor layer 20 and anode 18. First thickness T1 is less than second thickness T2. Similar to semiconductor device 10 of FIGS. 1A and 1B, because first thickness T1 is less than second thickness T2, thermal resistance between cathode 14 and semiconductor layer 20 may be less than thermal resistance between anode 18 and semiconductor layer 20 and thermal resistance between conductor link 16 and semiconductor layer 20. This may result in lower temperatures in cathode 14 relative to anode 18 and conductor link 16. In other words, the smaller first thickness T1 of insulating layer 22 between cathode 14 and semiconductor layer 20 than second thickness T2 between anode 18 and semiconductor layer 20 may increase a thermal gradient between anode 18 and cathode 14.

In some examples, as shown in FIG. 2B, first thickness T1 may be about half of second thickness T2. In other examples, first thickness T1 may be less than half of second thickness T2. The larger the difference in first thickness T1 and second thickness T2, the greater the temperature gradient between anode 18 and cathode 14, all other factors being equal.

Additionally, in some examples, as shown in FIG. 2B, cathode 14 may define a third thickness T3 and anode 18 may define a fourth thickness T4. Third thickness T3 and fourth thickness T4 are measured in the z-axis direction of FIG. 2B. Third thickness T3 is greater than fourth thickness T4. This may result in cathode 14 having greater volume (and surface area) than anode 18, which may further contribute to the thermal gradient between anode 18 and cathode 14.

Hence, the example semiconductor device 40 illustrated in FIGS. 2A and 2B includes multiple structural features that increases a thermal gradient between anode 18 and cathode 14. First, cathode 14 defines a larger volume than anode 18. Second, cathode 14 is thermally coupled to body-tie 46, which serves as a heat sink for cathode 14. Third, electrically insulating layer 22 may define a first, smaller thickness T1 at a location between semiconductor layer 20 and cathode 14 and a second, larger thickness T2 between semiconductor layer 20 and anode 18. Together, these structural features produce a larger temperature gradient between anode 18 and cathode 14, which may allow use of a lower programming current for programming programmable electrical fuse 12. As other examples, a larger temperature gradient may allow the programmable electrical fuse 12 to be smaller (e.g., a smaller cathode 14).

Figure 3A:
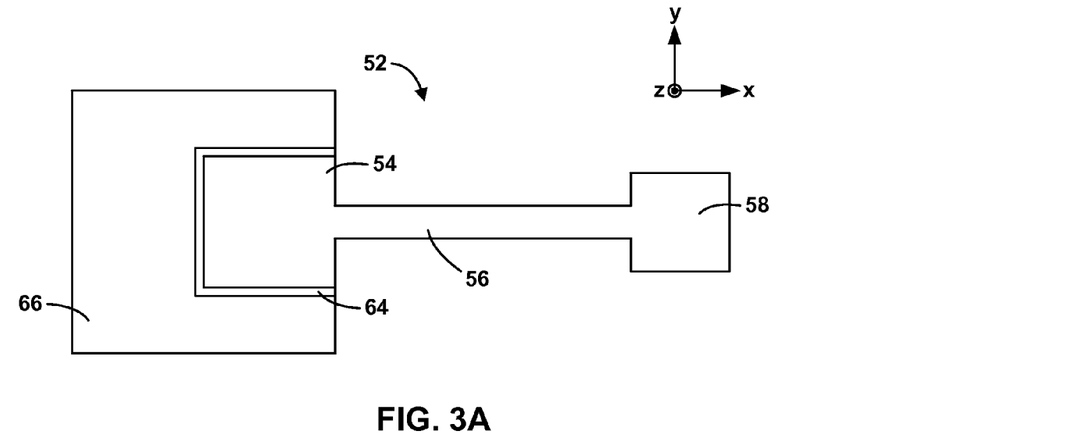
FIGS. 3A and 3B are conceptual and schematic diagrams illustrating an example semiconductor device including a programmable electrical fuse.
Figure 3B:
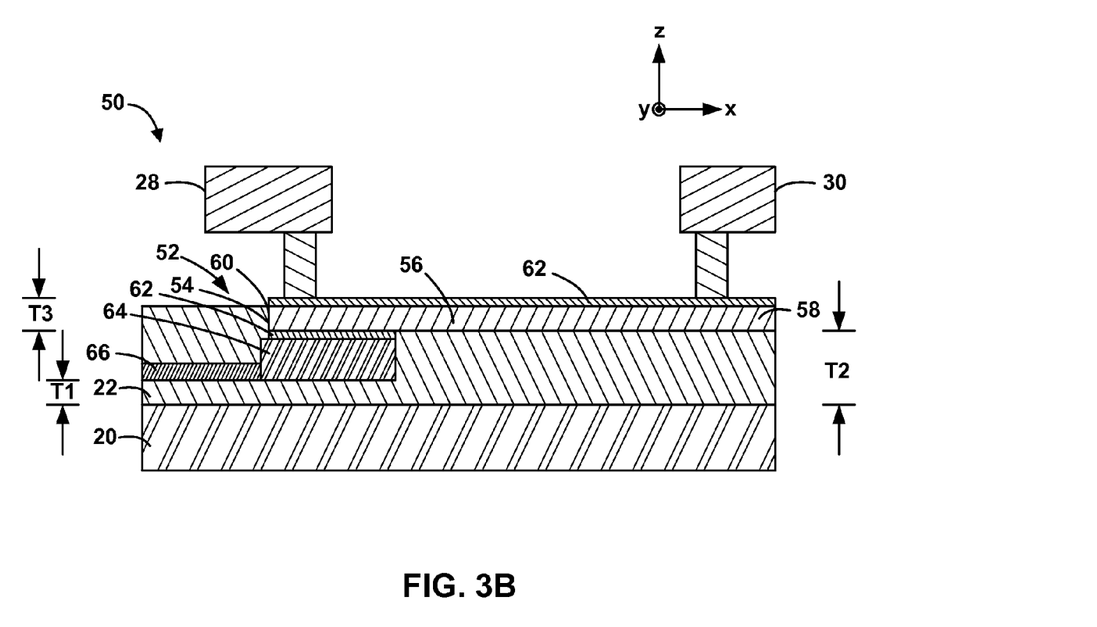

FIGS. 3A and 3B are conceptual and schematic diagrams illustrating another example semiconductor device 50 including a programmable electrical fuse 52. Although FIGS. 3A and 3B illustrate a single programmable electrical fuse 52, in some actual implementations, semiconductor device 50 may include a plurality of programmable electrical fuses 52, and may include other devices, such as transistors, resistors, capacitors, electrical interconnects among the devices, and the like. In some examples, semiconductor device 50, including programmable electrical fuse 52, may be similar to or substantially the same (e.g., the same or nearly the same) as semiconductor device 10 of FIGS. 1A and 1B, aside from the differences described herein.

In the example shown in FIGS. 3A and 3B, programmable electrical fuse 52 includes a cathode 54, a conductor link 56, and an anode 58. As shown in FIG. 3B, in contrast to programmable electrical fuse 12 of FIGS. 1A, 1B, 2A, and 2B, programmable electrical fuse 52 defines a substantially constant thickness (e.g., constant or nearly constant thickness), as measured in the z-axis direction of FIGS. 3A and 3B (where orthogonal x-y-z axes are shown for ease of description only).

Similar to programmable electrical fuse 12, programmable electrical fuse 52 includes a first layer 60 and a second layer 62. First layer 60 may include, for example, polysilicon. Second layer 62 may include, for example, a silicide, such as cobalt silicide or titanium silicide. FIG. 3B illustrates second layer 62 in an intact state present throughout cathode 54, conductor link 56, and anode 58. In examples in which programmable electrical fuse 52 is programmed to a higher resistance state, second layer 62 may be at least partially depleted along at least a portion of conductor link 56.

Cathode 54 overlies gate oxide 62. Gate oxide 62 may be formed of an oxide, such as silicon dioxide, and may prevent electrical connection between cathode 54 and silicon layer 64, while allowing thermal coupling of silicon layer 64 and cathode 54. In some examples, gate oxide 62 may define a relatively small thickness (measured in the z-axis direction of FIG. 2B), such as a thickness on the order of tens of angstroms.

Gate oxide 62 overlies at least a portion of silicon layer 64, and thermally couples silicon layer 64 and cathode 54. Silicon layer 64 comprises a highly thermally conductive material that may heat quickly as cathode 54 heats, e.g., during programming of programmable electrical fuse 52.

Additionally, silicon layer 64 reduces a thickness of electrically insulating layer 22 between cathode 54 and semiconductor substrate 20. As shown in FIG. 3B, electrically insulating layer 22 defines a first thickness T1 between semiconductor layer 20 and cathode 54 and a second thickness T2 between semiconductor layer 20 and anode 58. First thickness T1 is less than second thickness T2. Because first thickness T1 is less than second thickness T2 and silicon layer 64 is highly thermally conductive, thermal resistance between cathode 54 and semiconductor layer 20 may be less than thermal resistance between anode 58 and semiconductor layer 20 and thermal resistance between conductor link 56 and semiconductor layer 20. This may result in lower temperatures in cathode 54 relative to anode 58 and conductor link 56. In other words, the smaller first thickness T1 of insulating layer 22 between cathode 54 and semiconductor layer 20 than second thickness T2 between anode 58 and semiconductor layer 20 may increase a thermal gradient between anode 58 and cathode 54.

In some examples, as shown in FIG. 3B, first thickness T1 may be about half of second thickness T2. In other examples, first thickness T1 may be less than half of second thickness T2. The larger the difference in first thickness T1 and second thickness T2, the greater the temperature gradient between anode 58 and cathode 54, all other factors being equal.

Silicon layer 64 is thermally couples to body-tie 66. As shown in FIG. 3A, body-tie 66, along with silicon layer 64, increases an effective size of cathode 54 for purposes of thermal dissipation. As shown in FIG. 3A, in some examples, body-tie 66 may be larger than cathode 54 in both the x-axis direction and the y-axis direction. In other examples, body-tie 66 may be larger than cathode 54 in one of the x-axis direction or the y-axis direction, and may be the same size or smaller than cathode 54 in the other of the x-axis direction or the y-axis direction. This provides body-tie 66 with a relatively large volume in which to absorb heat transferred from cathode 54 and a relatively large surface area for dissipating the heat, e.g., to semiconductor layer 20. In this way, body-tie 66 may serve as a heat sink for cathode 54, receiving heat from cathode 54 via silicon layer 64.

Additionally, in some examples, body-tie 66 may allow routing of electrical interconnections above (in the z-axis direction of FIG. 3B) body-tie 66. In some examples, routing interconnections may not be practical or possible over cathode 54. Thus, using body-tie 66 may allow increased interconnect density compared to simply increasing an area of cathode 54.

In this way, semiconductor device 50 includes multiple structural features that increase a thermal gradient between anode 58 and cathode 54. Semiconductor device 50 includes a silicon layer 64, which may be highly thermally conductive and receive heat from cathode 54. Additionally, electrically insulating layer 22 defines a first, smaller thickness T1 between cathode 54 and semiconductor layer 20 and a second, larger thickness T2 between anode 58 and semiconductor layer 20. Further, semiconductor device 50 includes a body-tie 66 thermally coupled to silicon layer 64 and cathode 54, providing a heat sink for cathode 54. Together, these structures may create a larger thermal gradient between anode 58 and cathode 54, which may allow use of a lower programming current for programming programmable electrical fuse 52. As other examples, a larger temperature gradient may allow the programmable electrical fuse 52 to be smaller (e.g., a smaller cathode 54), which may allow an increased areal density of electrical fuses 52 in device 50.

Figure 4A:
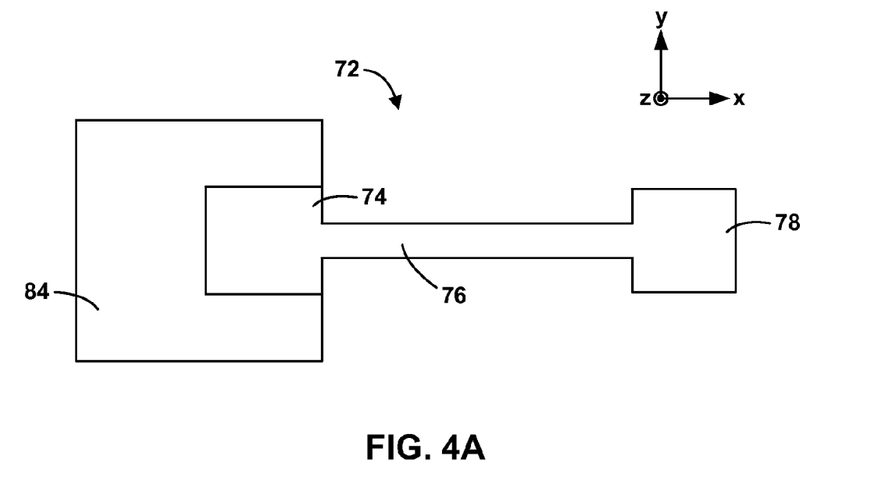
FIGS. 4A and 4B are conceptual and schematic diagrams illustrating an example semiconductor device including a programmable electrical fuse.
Figure 4B:
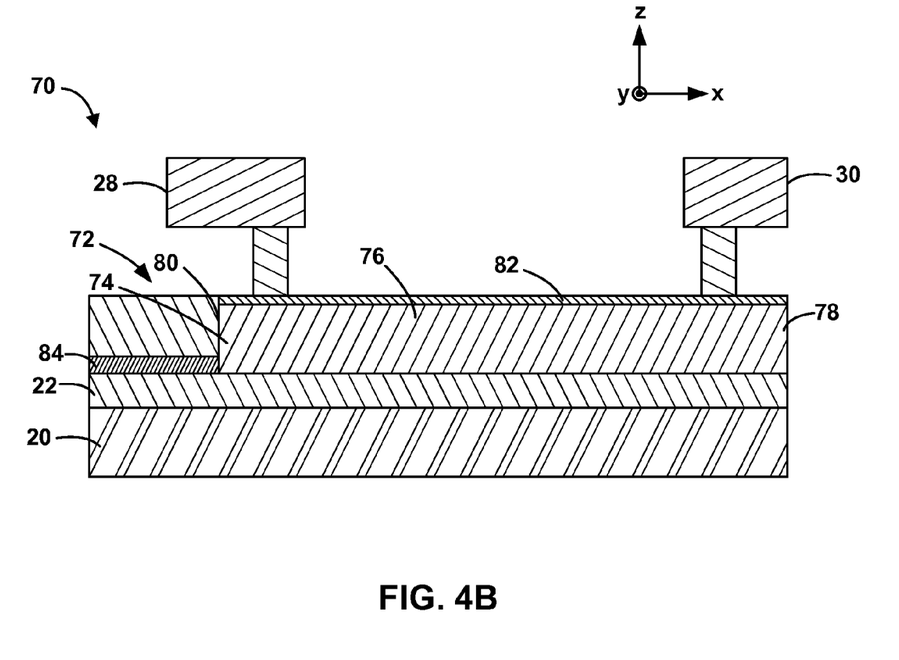

FIGS. 4A and 4B are conceptual and schematic diagrams illustrating another example semiconductor device 70 including a programmable electrical fuse 72. Although FIGS. 4A and 4B illustrate a single programmable electrical fuse 72, in some actual implementations, semiconductor device 70 may include a plurality of programmable electrical fuses 72, and may include other devices, such as transistors, resistors, capacitors, electrical interconnects among the devices, and the like. In some examples, semiconductor device 70, including programmable electrical fuse 72, may be similar to or substantially the same (e.g., the same or nearly the same) as semiconductor device 10 of FIGS. 1A and 1B, aside from the differences described herein.

Programmable electrical fuse 72 includes a cathode 74, a conductor link 76, and an anode 78. Programmable electrical fuse 72 includes a first layer 80 and a second layer 82. First layer 80 may include, for example, silicon. Second layer 82 may include, for example, a silicide, such as cobalt silicide or titanium silicide. FIG. 4B illustrates second layer 82 in an intact state present throughout cathode 74, conductor link 76, and anode 78. In examples in which programmable electrical fuse 72 is programmed to a higher resistance state, second layer 82 may be at least partially depleted along at least a portion of conductor link 76 due to the programming.

Cathode 74 is thermally coupled to body-tie 84. Body-tie 84 increases an effective size of cathode 74 for purposes of thermal dissipation. As shown in FIG. 4A, in some examples, body-tie 84 may be larger than cathode 74 in both the x-axis direction and the y-axis direction. In other examples, body-tie 84 may be larger than cathode 74 in one of the x-axis direction or the y-axis direction, and may be the same size or smaller than cathode 74 in the other of the x-axis direction or the y-axis direction. This provides body-tie 84 with a relatively large volume in which to absorb heat transferred from cathode 74 and a relatively large surface area for dissipating the heat, e.g., to semiconductor layer 20. In this way, body-tie 84 may serve as a heat sink for cathode 74, receiving heat from cathode 74.

Additionally, in some examples, body-tie 84 may allow routing of electrical interconnections above (in the z-axis direction of FIG. 4B) body-tie 84. In some examples, routing interconnections may not be practical or possible over cathode 74. Thus, using body-tie 84 may allow increased interconnect density compared to simply increasing an area of cathode 74.

In contrast to programmable electrical fuse 12, programmable electrical fuse 72 defines a substantially constant thickness, as does electrically insulating layer 22. Thus, the example of FIGS. 4A and 4B includes a single structural feature that provides greater thermal gradient between anode 78 and cathode 74: the thermal coupling of cathode 74 to body-tie 84.

Figure 5:
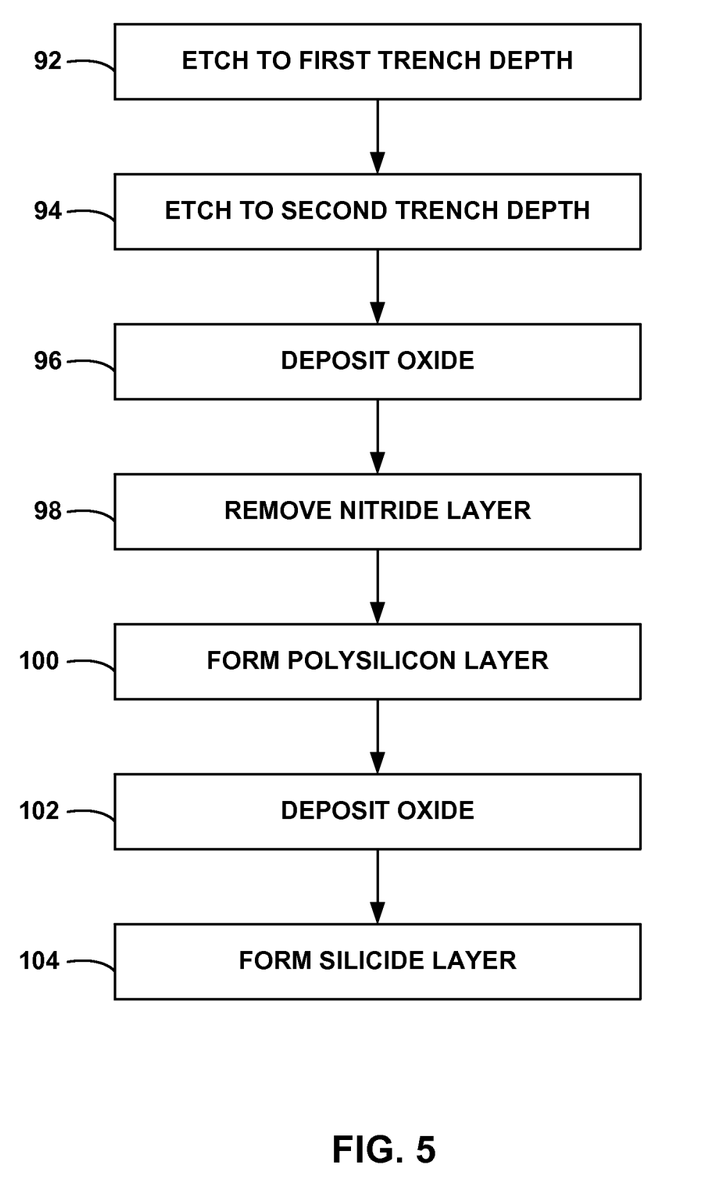
FIG. 5 is a flow diagram illustrating an example technique for forming a semiconductor conductor device including a programmable electrical fuse.
Figure 6A:
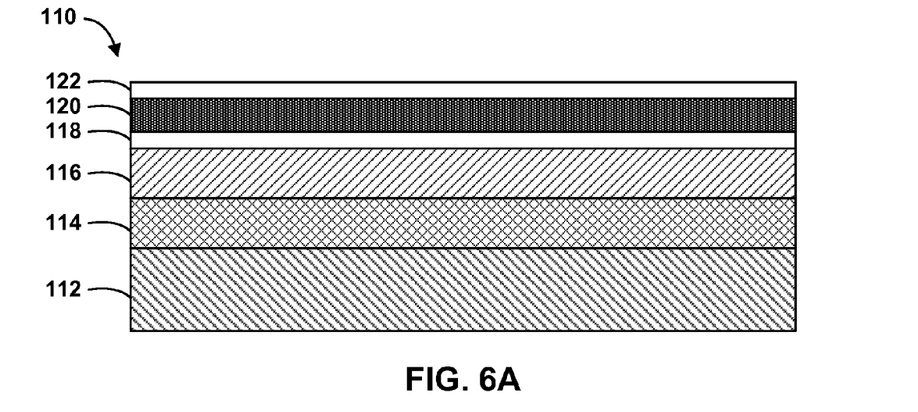
FIGS. 6A-6I are conceptual and schematic diagrams illustrating various steps of the technique of FIG. 5.
Figure 6B:
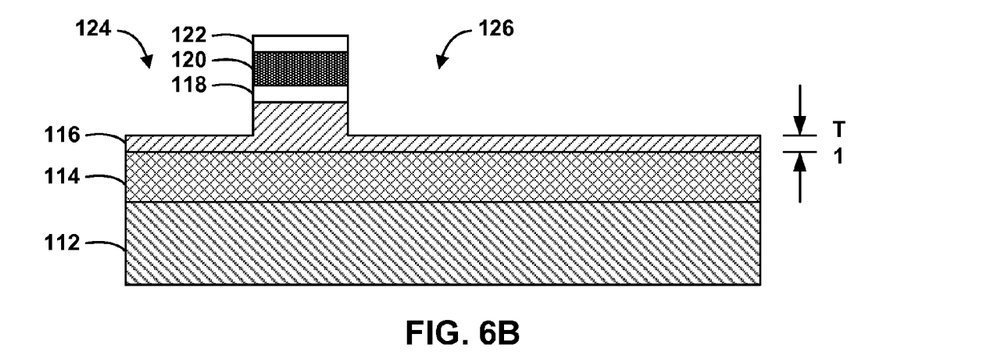
Figure 6C:
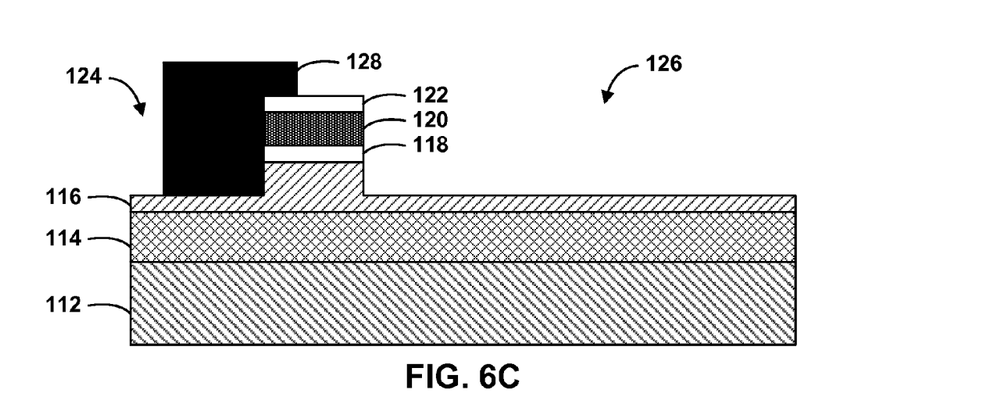
Figure 6D:
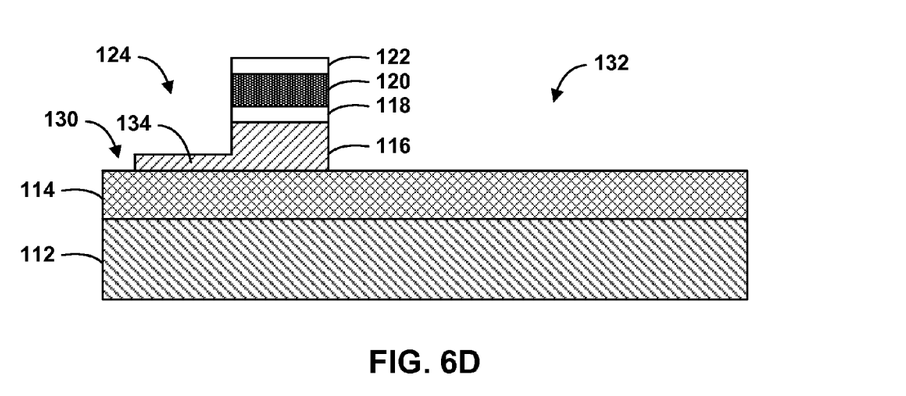
Figure 6E:
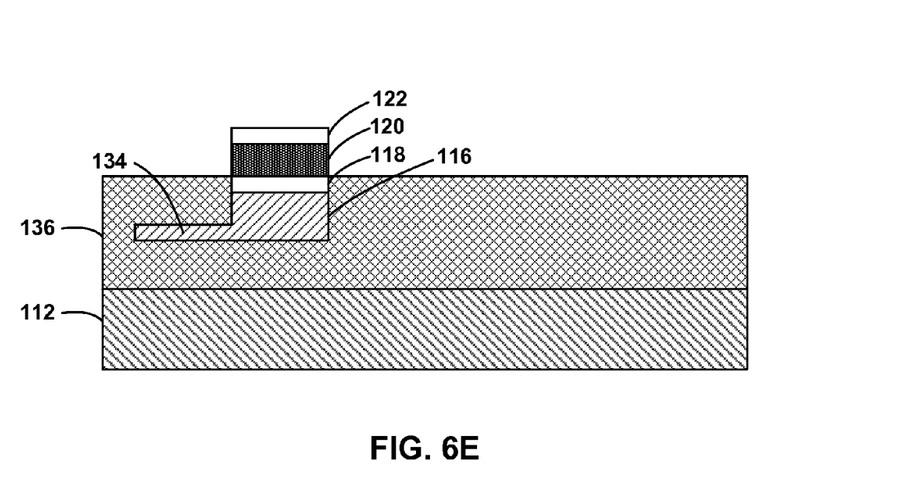
Figure 6F:
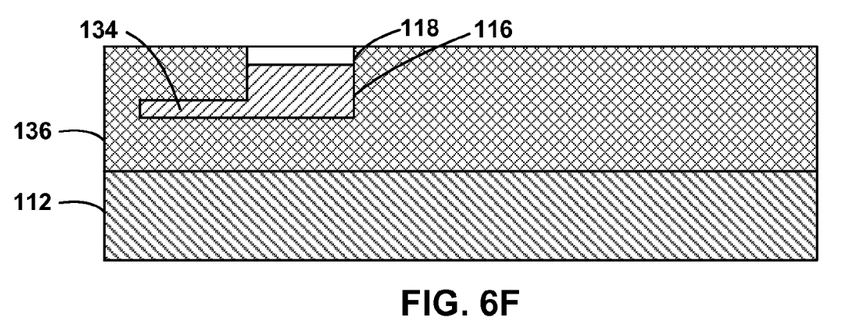

FIG. 5 is a flow diagram illustrating an example technique for forming a semiconductor conductor device including a programmable electrical fuse. The flow diagram of FIG. 5 will be described with reference to the conceptual and schematic diagrams of FIGS. 6A-6I for purposes of illustration only. In some examples, the technique of FIG. 5 may form semiconductor device 50 of FIGS. 3A and 3B, as shown in FIG. 6I. In other examples, the technique of FIG. 5 may be used to form other semiconductor devices or semiconductor device 50 may be formed by another technique.

The technique of FIG. 5 includes etching predetermined locations to a first trench depth in a silicon on insulator (SOI) 110 including a shallow trench isolation (STI) stack (92). SOI 110 includes a semiconductor layer 112, which may include bulk silicon, a buried oxide layer 114, which may include silicon dioxide, and a device layer 116, which may include a silicon layer. Formed on device layer 116 is a STI stack, which includes a first oxide layer 118, a nitride layer 120 formed on first oxide layer 118, and a second oxide layer 122 formed on nitride layer 120.

Etching predetermined locations to a first trench depth (92) may include depositing a photoresist mask on second oxide layer 122 and defining a "hard-mask" pattern. After formation of the hard-mask, the photoresist may be stripped. A silicon etch is performed, which stops within device layer 116, before buried oxide layer 114. The silicon etch forms first trenches 124 and 126, and leaves a thickness T1 of silicon in device layer 116. In this way, the silicon etch establishes a thickness T1 of a body-tie (e.g., body tie 66 shown in FIG. 3B).

To create the body-tie, the technique further includes etching portions of device layer 116 to a second trench depth (94). This etching step may include forming a photoresist mask 128, as shown in FIG. 6C, which defines where second trenches 130 and 132 (FIG. 6D) are formed. Second trench 130 defines the location of body-tie 134 (FIG. 6D). In addition, photoresist mask 128 establishes a width of body-tie 134 (which may be an example of body tie 66 shown in FIG. 3B) and a length of body-tie 134 (not shown).

In areas where a body-tie 134 is not to be created, photoresist mask 128 may be open. For instance, as shown in FIG. 6D, photoresist mask 128 does not block the second silicon etch in first trench 126, which results in device layer 116 being fully etched to form second trench 132 extending to buried oxide layer 114.

The technique then includes depositing an oxide layer (96). The oxide layer is formed over body-tie 134 and around device layer 116. In some examples, as shown in FIG. 6E, the oxide layer may include the same material as buried oxide layer 114 (e.g., silicon oxide), and may form an essentially continuous oxide layer 136.

The technique also includes removing nitride layer 120 and second oxide layer 122 (98). Nitride layer 120 may be removed using, for example, a hot-phosphoric strip. In some examples, oxide layers 136 and 118 may be planarized (e.g., chemically mechanically polished) before or after removal of nitride layer 120 and second oxide layer 122. The resulting structure is shown in FIG. 6F.

Figure 6G:
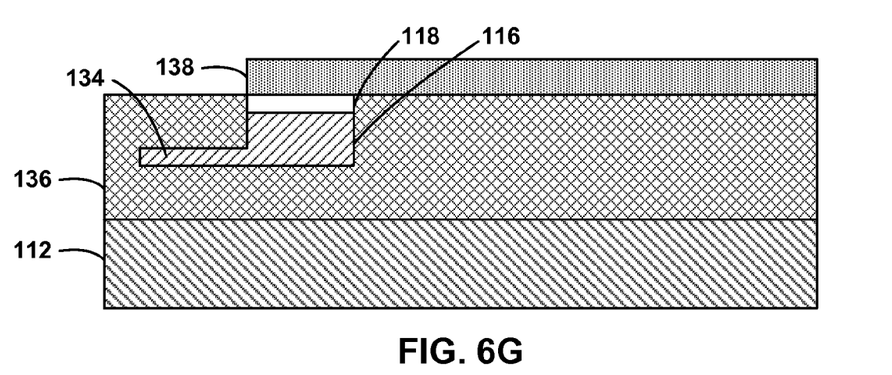

Polysilicon layer 138 is then formed on a surface of oxide layers 136 and 118 (100), as shown in FIG. 6G. In some examples, polysilicon layer 138 may be deposited as a layer on oxide layers 136 and 118. Polysilicon layer 138 then may be masked and etched to form the shape of a programmable electrical fuse (e.g., programmable electrical fuse 52 of FIGS. 3A and 3B). In other examples, polysilicon layer 138 may be formed in the desired shape of a programmable electrical fuse (e.g., programmable electrical fuse 52 of FIGS. 3A and 3B).

Figure 6H:
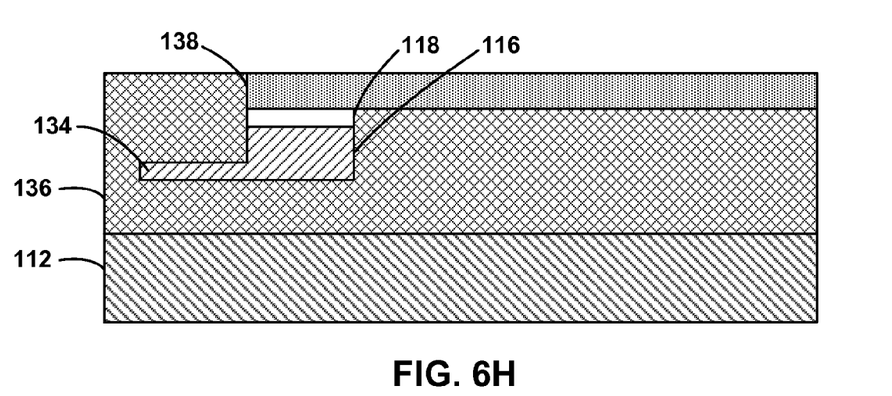
Figure 6I:
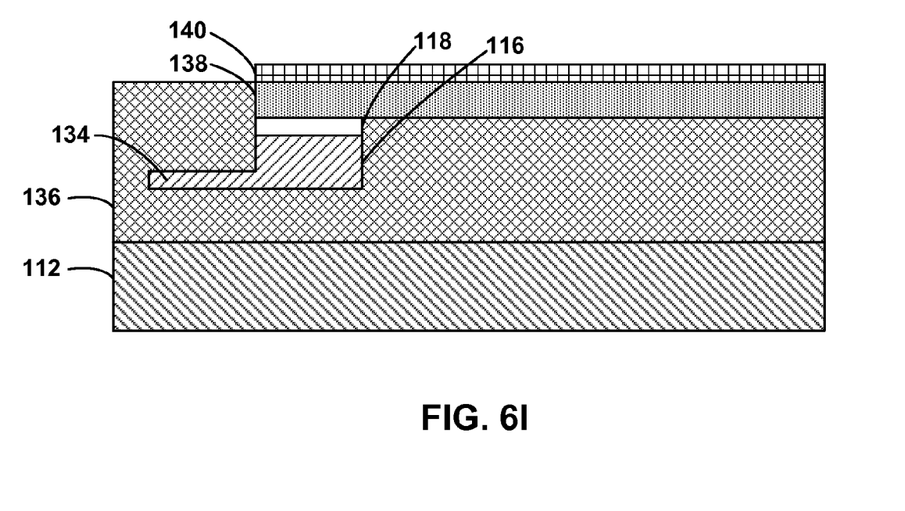

The technique also includes depositing an oxide surrounding polysilicon layer 138 (102). In other examples, the oxide may be deposited prior to polysilicon layer 138, the oxide etched to define a trench in the shape of the programmable electrical fuse, and the polysilicon deposited within the trench. In either case, the oxide may include the same material as oxide layer 138, and may form a substantially continuous oxide layer (as shown in FIG. 6H).

The technique further includes forming a silicide layer 140 on polysilicon layer 138 (104). Similar to polysilicon layer 138, in some examples, silicide layer 140 may be deposited as a layer on polysilicon layer 138 and reacted to form the shape of a programmable electrical fuse (e.g., programmable electrical fuse 52 of FIGS. 3A and 3B). The unreacted silicide is then wet stripped from the surface. In other examples, silicide layer 140 may be formed in the desired shape of a programmable electrical fuse (e.g., programmable electrical fuse 52 of FIGS. 3A and 3B). The resulting structure is shown in FIG. 6I.

Although not shown in FIGS. 5 and 6A-6I, the device may undergo further processing, e.g., to form interconnects between various components of the device. Such processing may be performed using known back-end-of-line (BEOL) operations. The resulting product may include a semiconductor device, such as semiconductor device 50 shown in FIGS. 3A and 3B.

Although various features of semiconductor devices 10, 40, 50, and 70 have been described with reference to different examples, the various features can be used in combinations other than those described herein, as will be apparent to those of ordinary skill in the art. These and other examples are within the scope of the following claims.

What is claimed is:

1. A device comprising:
   a semiconductor substrate;
   an electrically insulating layer overlying the semiconductor substrate; and
   a programmable electrical fuse overlying a portion of the electrically insulating layer,
      wherein the programmable electrical fuse comprises a cathode, an anode, and a conductor link physically connecting the cathode and the anode,
      wherein the electrically insulating layer defines a first insulating layer thickness between the semiconductor substrate and the cathode and a second insulating layer thickness between the semiconductor substrate and the anode, and wherein the first insulating layer thickness is less than the second insulating layer thickness,
      wherein a thickness of the cathode, measured in a direction substantially normal to a surface of the semiconductor substrate, is greater than a thickness of the anode, measured in the direction substantially normal to the surface of the semiconductor substrate.

2. The device of claim 1, wherein the programmable electrical fuse comprises a polysilicon layer and a silicide layer overlying at least a portion of the polysilicon layer or a silicon layer and a silicide layer overlying at least a portion of the silicon layer.

3. The device of claim 1, further comprising a silicon heat sink and a gate oxide, wherein the cathode overlies the gate oxide and at least a portion of the silicon heat sink.

4. The device of claim 3, further comprising a body tie, wherein the body tie is thermally coupled to the silicon heat sink.

5. The device of claim 1, further comprising a body tie and a gate oxide, wherein the cathode overlies the gate oxide and at least a portion of the body tie.

6. The device of claim 1, wherein the programmable electrical fuse further comprises a body-tie adjacent to the cathode and thermally coupled to the cathode.

7. The device of claim 1, wherein the first insulating layer thickness is less than half of the second insulating layer thickness.

8. A method comprising:
   forming a programmable electrical fuse overlying a portion of an electrically insulating layer, the electrically insulating layer overlying a semiconductor substrate, wherein the programmable electrical fuse comprises a cathode, an anode, and a conductor link connecting the cathode and the anode, wherein the electrically insulating layer defines a first insulating layer thickness between the cathode and the semiconductor substrate and a second insulating layer thickness between the anode and the semiconductor substrate, wherein the first insulating layer thickness is less than the second insulating layer thickness, and wherein a thickness of the cathode, measured in a direction substantially normal to a surface of the semiconductor substrate, is greater than a thickness of the anode, measured in the direction substantially normal to the surface of the semiconductor substrate.

9. The method of claim 8, wherein the first insulating layer thickness is less than half of the second insulating layer thickness.

10. The method of claim 8, further comprising forming a body-tie overlying at least a portion of the electrically insulating layer, wherein the cathode is thermally coupled to the body-tie.

11. The method of claim 10, wherein forming the programmable electrical fuse overlying at least the portion of the electrically insulating layer comprises forming the cathode overlying at least a portion of the body-tie.

12. The method of claim 8, wherein forming the programmable electrical fuse comprises forming a polysilicon layer or a silicon layer, and forming a silicide layer overlying at least a portion of the polysilicon layer or the silicon layer.

13. The method of claim 8, further comprising:
   forming a silicon layer overlying a portion of the electrically insulating layer, and
   forming a gate oxide overlying the silicon layer, wherein the cathode overlies the gate oxide and at least a portion of the silicon layer.

14. A device comprising:
   a semiconductor substrate;
   an electrically insulating layer overlying the semiconductor substrate;
   a silicon layer overlying a portion of the electrically insulating layer;
   a gate oxide overlying at least a portion of the silicon substrate; and
   a programmable electrical fuse overlying a portion of the electrically insulating layer and the gate oxide, wherein the programmable electrical fuse comprises a cathode, an anode, and a conductor link physically connecting the cathode and the anode, wherein the electrically insulating layer defines a first thickness between the semiconductor substrate and the cathode and a second thickness between the semiconductor substrate and the anode, wherein the first thickness is less than the second thickness, and wherein the cathode overlies the gate oxide and is thermally coupled to the silicon layer through the gate oxide.

15. The device of claim 14, wherein the silicon layer comprises a body-tie.

16. The device of claim 14, wherein the programmable electrical fuse defines a first fuse thickness at the cathode and a second fuse thickness at the anode, and wherein the first fuse thickness is greater than the second fuse thickness.

\* \* \* \* \*